United States Patent [19]
Weigand

[11] Patent Number: 5,990,580
[45] Date of Patent: Nov. 23, 1999

[54] SINGLE POLE DOUBLE THROW SWITCH

[75] Inventor: Christopher Dirk Weigand, Woburn, Mass.

[73] Assignee: The Whitaker Corporation, Wilmington, Del.

[21] Appl. No.: 09/035,456

[22] Filed: Mar. 5, 1998

[51] Int. Cl.[6] .................................................. H01H 47/00
[52] U.S. Cl. ........................ 307/125; 307/116; 307/130; 327/427
[58] Field of Search ..................... 307/112, 116, 307/125, 130, 132 M, 85–87; 327/374, 379, 427; 333/2, 101, 17.1

[56] References Cited

U.S. PATENT DOCUMENTS

| | | | |
|---|---|---|---|
| 5,274,343 | 12/1993 | Russell et al. | 333/103 |
| 5,350,957 | 9/1994 | Cooper et al. | 327/427 |
| 5,731,607 | 3/1998 | Kohama | 257/275 |
| 5,812,939 | 9/1998 | Kohama | 455/78 |
| 5,825,227 | 10/1998 | Kohama et al. | 327/308 |

Primary Examiner—Richard T. Elms
Assistant Examiner—Peter Zura
Attorney, Agent, or Firm—Gerald K. Kita

[57] ABSTRACT

An electronic SPDT switch (1) has, a series FET (9) in a first circuit arm (4) between a common port (2) and a first port (3), a shunt FET (10) in a second circuit arm (6) between the common port (2) and a second port (5), the shunt FET (10) being isolated 90 degrees or ¼ wavelength from the common port (2), a source applying pull-up voltage to sources of respective FETs (9, 10) and to the common port (2), to provide a connection of the common port (2) with said second port (5), a source applying a first control voltage of opposite logic state to said gates, and the FETs (9, 10) being depletion mode FETs that conduct at a zero sum of said bias voltage and said control voltage, and that conduct when DC power is interrupted, to provide a connection of the common port (2) with the first port (3).

14 Claims, 2 Drawing Sheets

SINGLE POLE DOUBLE THROW SWITCH

FIELD OF THE INVENTION

The invention relates to a SPDT, single pole, double throw switch with a default state, and more particularly, to a SPDT switch that returns to a default state when DC power to the switch is interrupted.

BACKGROUND OF THE INVENTION

A known switch is fabricated with PIN diodes that switch between conducting states and nonconducting states. Each PIN diode can switch to a nonconducting state due to a back bias voltage or, in the absence of back bias, a massive, thick construction, which increases the switching times for the PIN diode, and which limits the electrical isolation. Each PIN diode has a characteristically slow switching speed and requires significant DC power.

SUMMARY OF THE INVENTION

The invention relates to an electronic SPDT switch that requires low DC power, and returns to a default state without significant time delay, when DC power to the switch is interrupted. The invention further relates to a SPDT switch having depletion mode FETs, field effect transistors. According to an embodiment, the FETs control switching connection of a common RF port to, either a first RF port, or a second RF port, and the FETs switch the common RF port to a desired RF port without significant time delay, when DC power to the switch is interrupted.

DESCRIPTION OF THE DRAWINGS

Embodiments of the invention will now be described by way of example with reference to the accompanying drawings, according to which.

DESCRIPTION

Figure 1:
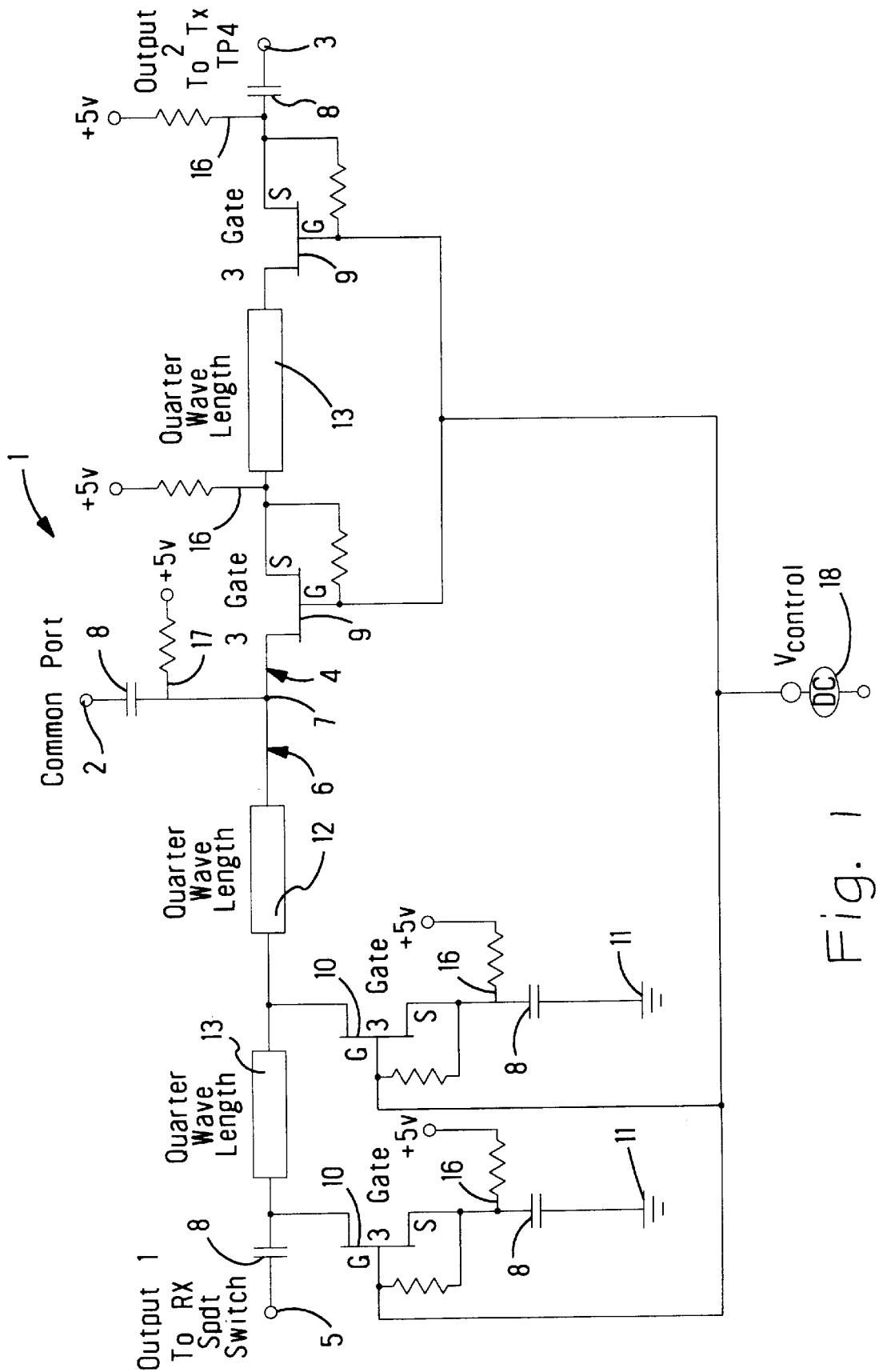
FIG. 1 is a schematic diagram of an electronic SPDT switch.

With reference to FIG. 1, an electronic SPDT switch 1 comprises, a common port 2 adapted to be switched between a first port 3 in a first circuit arm 4, and a second port 5 in a second circuit arm 6. The first and second circuit arms 5, 6 are connected at a common junction 7 of the common port 2. Each of the ports 2, 3, 5 is an RF port having a series connected, DC blocking capacitor 8. Typically, an RF signal, applied to the common port 2, can be connected to, and switched between, the first port 3 and the second port 5.

On the first circuit arm 4, at least one series FET 9 connects the common junction 7 with the first port 3. When each series FET 9 is conducting, a connection is established of the common port 2 with the first port 3.

On the second circuit arm 6, the second port 5 is connected to at least one, shunt FET 10 shunted to ground or earth electrical potential at 11, through a DC blocking capacitor 8. Each shunt FET 10 is isolated 90 degrees or ¼ wavelength from the common junction of the common port by a circuit element 12, for example, by a frequency tuned lumped element or a ¼ microstrip delay line. When each series connected FET 9 is conducting, the first circuit arm 3 appears as an open circuit to each, ¼ wavelength away, shunt FET 10, which renders the second circuit arm 6 in an isolation state.

The use of two series FETs 9 in the first circuit arm 4, isolated by 90 degrees or ¼ wavelength apart from one another, increases the isolation to twice the isolation of a single FET plus 6 dB. Accordingly, a second series FET 9 is shown in the first circuit arm 4. A circuit element 13, for example, a frequency tuned lumped element, or ¼ wavelength microstrip MMIC delay line, isolates respective series FETs 9 from one another.

Two shunt FETs 10 are shown in the second circuit arm 6, isolated by 90 degrees or ¼ wavelength apart from one another, which increases the isolation to twice the isolation of a single FET +6 dB. An additional circuit element 13, for example, frequency tuned, lumped elements, or ¼ wavelength microstrip MMIC delay lines, isolate respective series FETs 9 from one another.

Figure 2:
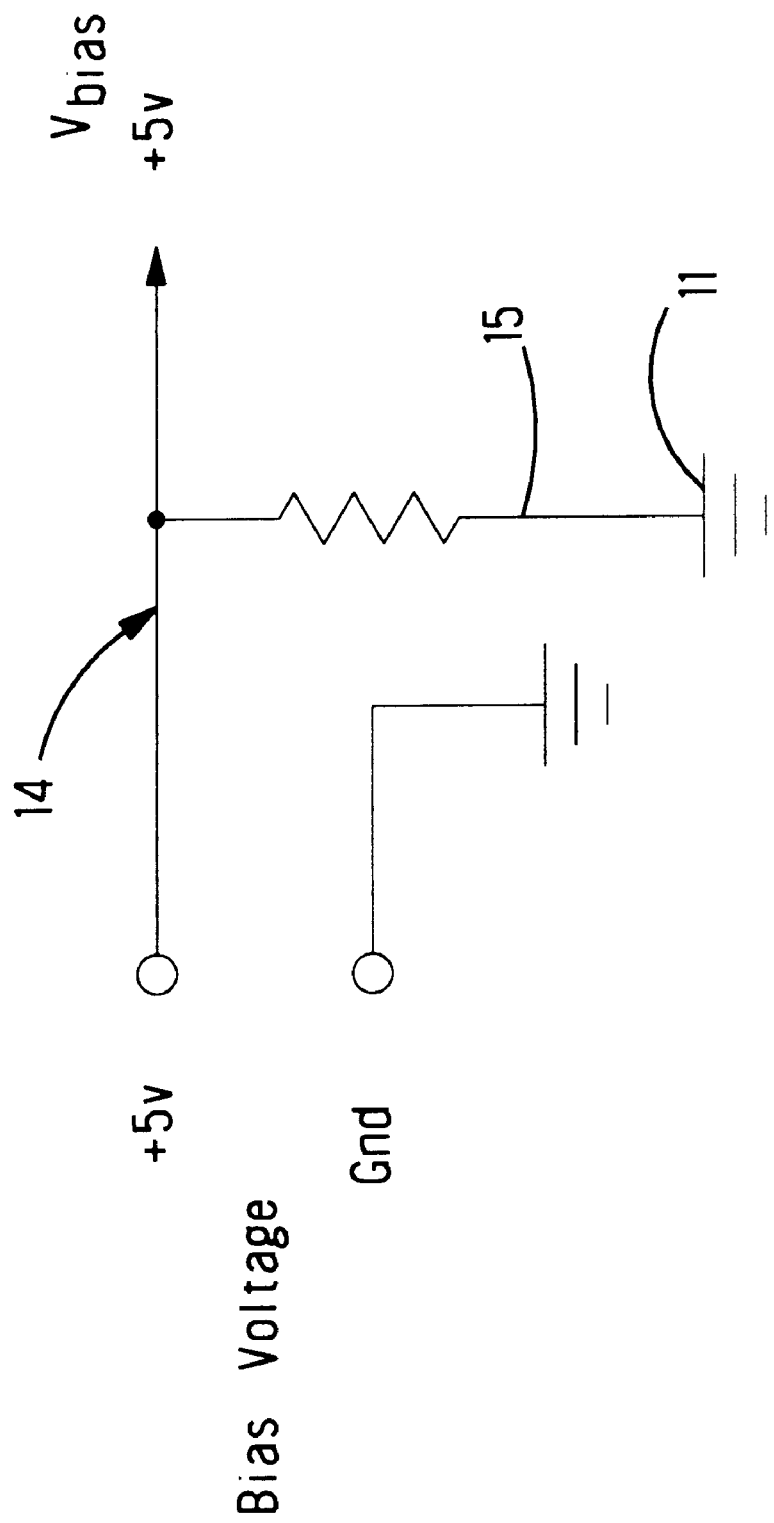
FIG. 2 is a schematic diagram of a source of bias voltage for the switch as shown in FIG. 1.

With reference to FIG. 2, a source 14 of DC bias voltage $V_{bias}$ will now be described. The source 14 of DC bias voltage comprises, for example, a power supply or a battery producing a voltage $V_{bias}$=+5 V. For a switch of GaAs semiconductor structure, the voltage can be larger or smaller than 5 V as long as the voltage is sufficient to drive the GaAs switch, and is compatible with the bias requirements of the driver. The source 14 of bias voltage has a DC return 15 from the +5 V bias source to ground at 11, to quickly discharge the +5 V bias potential to ground at 11 without significant delay.

To connect the common port 2 with the second port 5, the source 14 of DC bias voltage applies a first pull-up voltage, designated as, bias voltage, $V_{bias}$=+5 V, that is applied to pull-up resistors at the FET sources 16 of respective FETs 9 and 10 and to the common port 2 at 17.

The respective FETs 9 and 10 are depletion mode FETs that are conducting solely when their GS gates are unbiased, at zero voltage. Thus, the voltage across the gate-source junction on each of the FETs 9 and 10 becomes $V_{GS}$=−5 V, and the FETs 9 and 10 are pinched off, which removes each of the shunts to ground from the second circuit arm 6 to connect the common port 2 with the second port 5. The first port 3 becomes isolated from the common port 2 due to each of the pinched off, series FETs 10 in the first circuit arm 4.

With further reference to FIG. 1, switching the connection of the common port 2 to a connection with the first port 3 will now be described. A source 18 of a DC control voltage applies a second bias voltage, $V_{control}$=+5 V, that sets the voltage across the gate-source of the FETs to 0 V. For example, by applying $V_{control}$=+5 V at one side of the GS gates while the $V_{bias}$=+5 V is applied at another side of the GS gates, there is no voltage across the gate-source junction. The FETs 9 and 10, being depletion mode FETs, conduct at a zero sum of said bias voltage $V_{bias}$ and said control voltage $V_{control}$ to switch a connection of the common port 2 to the first port 3.

The first circuit arm 4 is desired to be conducting when DC power is interrupted. For example, the FETs 9 and 10 may be conducting when DC power is interrupted to said sources 14 18 of said first bias and first control voltages, $V_{bias}$ and $V_{control}$, to switch a connection of the common port 2 with the second port 5 to a connection of the common port with the first port 3. The second arm 6 of the SPDT switch 1 is nonconducting when DC power is interrupted.

Using the FETs 9 and 10 as switching elements means that the bias current of the switch 1 has a magnitude in the order of several mA, milli-Amps, allowing a small battery to supply DC power. Although single gate FETs are shown, to operate at low RF power, when higher RF power operation is desired, the use of double gate FETs and triple gate FETs allow operation at higher RF power.

The depletion loss FETs 9 and 10 provide a switching time of approximately 25 ns, nanoseconds, especially from FETs of GaAs fabrication. By comparison, a PIN diode can switch to a nonconducting state due to a back bias voltage or, in the absence of back bias, a massive, thick construction, which increases the switching times for the PIN diode, and which limits the electrical isolation. A PIN diode switch operates with relatively high DC power requirements, and is unsuited for low DC power dissipation requirements.

By using depletion mode FETs, each FET 9 and 10 is in the low resistance mode, conducting or being on, when no DC power is applied. Each series connected FET 10 is on in the absence of DC power, as when a bias voltage $V_{GS}$ =0.0 V is present across the GS junction of each FET 10. Each series conducting FET 9 connects the RF signal at the common port 2 with the output port 3, when a voltage $V_{GS}$=0.0 V is present across the GS junction of each FET 9 and 10. The second arm 6 of the switch 1 is nonconducting, due to each shunt connected FET 9, being tuned at the frequency of interest, ¼ wavelength or 90 degrees away, from the junction 7 of the common port 2.

The voltage $V_{GS}$=0.0 V is obtained when the bias voltage $V_{bias}$=+5 V and the control voltage $V_{control}$=+5 V.

The switch 1 in the default state has the common port 2 connected with the first port 3, when the bias voltage $V_{bias}$=0.0 V, due to interruption of DC power, and the control voltage becomes $V_{control}$=0.0 V. The source 14 of bias voltage has a DC return 15 from the +5 V bias source to ground at 11, so that, as power is interrupted, the bias potential of +5 V is quickly discharged to ground or earth electrical potential. A voltage $V_{GS}$=0.0 V will be present at the GS gate of each FET 9 and 10.

When it is desired to connect the common port 2 with the second port 5, the control voltage at source 18 is set to 0.0 V, such that, $V_{control}$=0.0 V, and the bias voltage $V_{bias}$=+5 V. The voltage across each GS gate of the FETs 9 and 10 becomes $V_{GS}$=−5 V, and the FETs 9 and 10 are pinched off, which removes a shunt from the second circuit arm 6 to connect the common port 2 with the second port 5. The first port 3 becomes isolated from the common port 2 due to each pinched off, series FET 10 in the first circuit arm 4.

Although an embodiment of the invention has been described, other embodiments and modifications are intended to be covered by the spirit and scope of the appended claims.

What is claimed is:

1. An electronic SPDT switch comprising:
    a common port adapted to be switched between a first port in a first circuit arm and a second port in a second circuit arm,
    a series FET in the first circuit arm between the common port and the first port,
    a shunt FET in the second circuit arm between the common port and the second port, the shunt FET being connected to ground, the shunt FET being spaced 90 degrees or ¼ wavelength from the common port,
    a source of bias voltage applying a pull-up voltage to gates of respective FETs and to the common port, to provide a connection of the common port with said second port,
    a source of control voltage applying a second bias voltage of opposite polarity to said gates, and
    the FETs being depletion mode FETs conducting at a zero sum of said bias voltage and said control voltage to switch said connection to a connection of the common port with the first port, and
    the FETs conducting when DC power is interrupted to said sources of said first and second bias voltages to switch said connection to a connection of the common port with the first port.

2. An electronic switch as recited in claim 1 wherein, said common port and said first and second ports each have DC blocking capacitors.

3. An electronic switch as recited in claim 1 wherein, a ¼ wavelength microstrip spaces the shunt FET 90 degrees or ¼ wavelength from the common port.

4. An electronic switch as recited in claim 1 wherein, a lumped element spaces the shunt FET 90 degrees or ¼ wavelength from the common port.

5. An electronic switch as recited in claim 1, and further comprising: multiple shunt FETs in the second circuit arm between the second port and the first recited FET, said shunt FETs being spaced 90 degrees or ¼ wavelength from the one another.

6. An electronic switch as recited in claim 1, and further comprising: multiple shunt FETs in the second circuit arm being spaced 90 degrees or ¼ wavelength from one another.

7. An electronic switch as recited in claim 1, and further comprising: multiple series FETs in the first circuit arm being spaced 90 degrees or ¼ wavelength from one another, and multiple shunt FETs in the second circuit arm being spaced 90 degrees or ¼ wavelength from one another.

8. An electronic SPDT switch comprising:
    a common port adapted to be switched between a first port in a first circuit arm and a second port in a second circuit arm,
    one or more series FETs in the first circuit arm between the common port and the first port,
    one or more shunt FETs in the second circuit arm between the common port and the second port, the shunt FETs being connected to ground, the shunt FETs being isolated 90 degrees or ¼ wavelength from the common port,
    each of the shunt FETs being isolated 90 degrees or ¼ wavelength from one another,
    a source of bias voltage applying a first bias voltage to gates of respective FETs and to the common port, to provide a connection of the common port with the second port,
    a source of control voltage applying a second bias voltage of opposite polarity to said gates,
    the FETs being depletion mode FETs conducting at a zero sum of said bias voltage and said control voltage to switch said connection to a connection of the common port with the first port, and
    the FETs conducting when DC power is interrupted to said sources of said first bias and first control voltages to switch said connection to a connection of the common port to the first port.

9. An electronic switch as recited in claim 8 wherein, said common port and said first and second ports each have DC blocking capacitors.

10. An electronic switch as recited in claim 8 wherein, a ¼ wavelength microstrip isolates the shunt FETs 90 degrees ¼ wavelength from the common port.

11. An electronic switch as recited in claim 8 wherein, a lumped element isolates the shunt FETs 90 degrees or ¼ wavelength from the common port.

12. An electronic switch as recited in claim 8 wherein, the shunt FETs are isolated 90 degrees or ¼ wavelength from one another.

13. An electronic switch as recited in claim 8 wherein, lumped elements isolate respective shunt FETs 90 degrees or ¼ wavelength from one another.

14. An electronic switch as recited in claim 8 wherein, ¼ wavelength microstrip lines isolate respective shunt FETs 90 degrees or ¼ wavelength from one another.

\* \* \* \* \*